US009692366B2

(12) United States Patent
Pilgram

(10) Patent No.: US 9,692,366 B2
(45) Date of Patent: Jun. 27, 2017

(54) ENVELOPE TRACKING PATH DELAY FINE TUNING AND CALIBRATION

(71) Applicant: Intel Corporation, Santa Clara, CA (US)

(72) Inventor: Berndt Pilgram, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/564,162

(22) Filed: Dec. 9, 2014

(65) Prior Publication Data

US 2016/0164550 A1  Jun. 9, 2016

(51) Int. Cl.
| | |
|---|---|
| H03F 1/02 | (2006.01) |
| H04B 1/04 | (2006.01) |
| H03F 3/19 | (2006.01) |
| H03F 1/30 | (2006.01) |
| H03F 1/32 | (2006.01) |
| H03F 3/181 | (2006.01) |
| H03F 3/24 | (2006.01) |

(52) U.S. Cl.
CPC ............ *H03F 3/19* (2013.01); *H03F 1/0227* (2013.01); *H03F 1/30* (2013.01); *H03F 1/3247* (2013.01); *H03F 3/181* (2013.01); *H03F 3/245* (2013.01); *H03F 2200/102* (2013.01); *H03F 2200/129* (2013.01); *H03F 2200/336* (2013.01); *H03F 2200/451* (2013.01); *H03F 2201/3233* (2013.01); *H04B 2001/0408* (2013.01); *H04B 2001/0416* (2013.01)

(58) Field of Classification Search
CPC ............................. H03F 1/0211; H03F 1/0227
USPC .................................................. 375/295–297
See application file for complete search history.

(56) References Cited

U.S. PATENT DOCUMENTS

| | | | |
|---|---|---|---|
| 9,055,529 B2* | 6/2015 | Shih ................. | H04W 52/0209 |
| 2005/0079835 A1* | 4/2005 | Takabayashi ........ | H03G 3/3042 |
| | | | 455/127.1 |
| 2013/0076418 A1* | 3/2013 | Belitzer et al. ............... | 327/161 |
| 2013/0235949 A1 | 9/2013 | Jeckeln | |
| 2014/0213196 A1 | 7/2014 | Langer et al. | |
| 2014/0235185 A1* | 8/2014 | Drogi ......................... | 455/114.2 |

* cited by examiner

*Primary Examiner* — Kevin M Burd
(74) *Attorney, Agent, or Firm* — Eschweiler & Potashnik, LLC

(57) ABSTRACT

A power amplifier of an envelope tracking system is configured to generate an output power with a variable supply voltage that is generated in an envelope tracking path. A signal generation/processing path receives an input signal and processes the input signal to the power amplifier in a main signal processing path. A delay component is configured to generate a delay to the envelope tracking path with respect to the signal generation path. A feedback path is configured to generate a feedback signal from the output of the power amplifier and adjust the delay component or the delay of the delay component during an active transmission or an active transmission mode.

22 Claims, 8 Drawing Sheets

ENVELOPE TRACKING PATH DELAY FINE TUNING AND CALIBRATION

FIELD

The present disclosure relates to envelope tracking, and more specifically, an envelope tracking path delay fine tuning and calibration.

BACKGROUND

An efficient way to optimize the power amplifier (PA) current consumption in a wireless system across the entire output power range is the use of a DC-DC converter to provide a variable PA supply voltage to a PA. Depending on the RF output power, for example, the output voltage of the DC-DC converter to the PA is adjusted. As the output power lowers, the PA supply voltage to the PA also lowers as a result. Due to a voltage conversion from the battery voltage down to the lower PA supply voltage, the battery current is reduced. Alternatively, the DC-DC converter output voltage can be fixed based on the target RF power (average RF power), which is expected in a next period of time. This procedure is sometimes called average power tracking (APT), in which a constant voltage is supplied to the PA.

Envelope tracking DC-DC (ET DC-DC) converters or envelope tracking modulators are capable of envelope tracking to further reduce the battery current. Envelope tracking describes an approach to RF amplifier design, for example, in which the power supply voltage applied to the power amplifier is constantly adjusted to ensure that the amplifier is operating at peak efficiency for the given instantaneous output power requirements.

A feature of envelope tracking is that the supply voltage of the power amplifier is not constant. The supply voltage of the power amplifier depends on the instantaneous envelope of the modulated baseband signal or radio frequency (RF) input signal, which is input into the PA. For example, an ET DC-DC converter follows the instantaneous envelope of the RF signal, which removes the voltage headroom and further increases the system efficiency (composite efficiency of the power amplifier and the DC-DC converter). An ET DC-DC converter, for example, can reduce the battery current of a Long Term Evolution (LTE) signal by roughly 20+% at maximum output power relative to a standard DC-DC converter, which simply follows an average power or a constant power supply.

DETAILED DESCRIPTION

Figure 1:
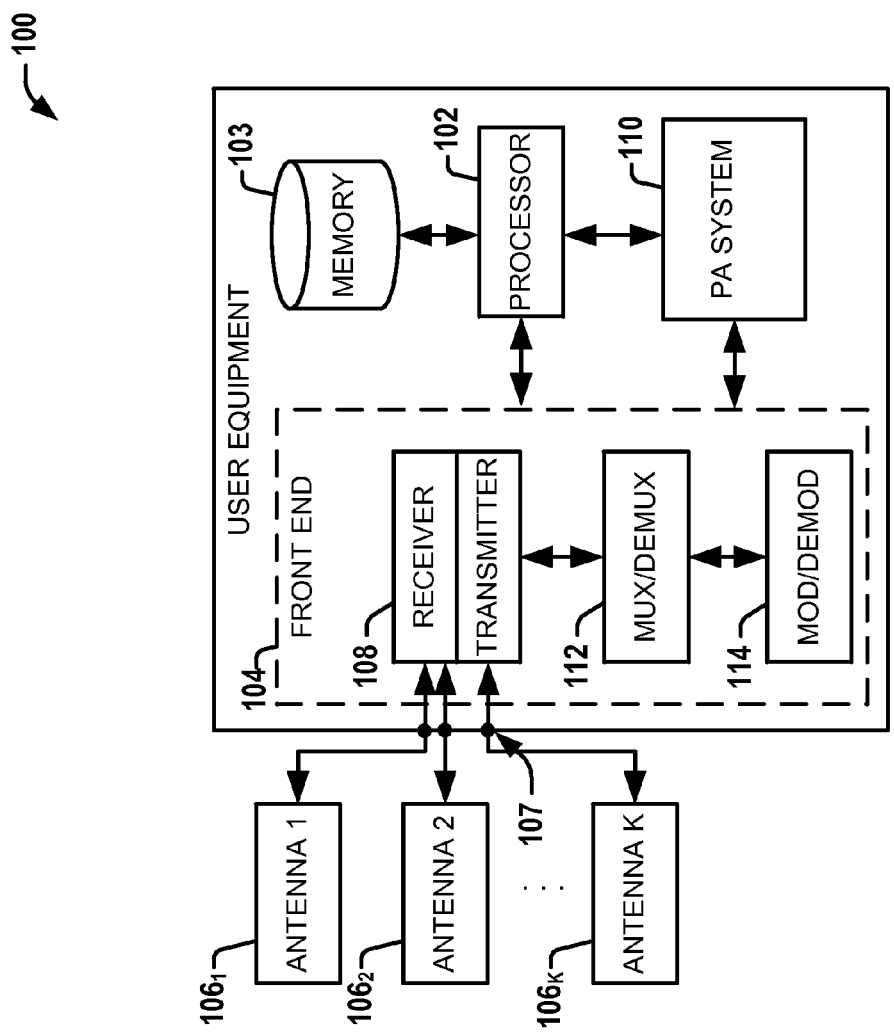
FIG. 1 is a block diagram illustrating a PA system or device according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of power control schemes for PAs, various aspects are described for envelope tracking systems that comprise a main signal processing pathway and an envelope tracking pathway to a power amplifier. The power amplifier can be a component of a radio frequency transmitter/receiver, an acoustic transmitter/receiver, or other communication device, for example. The power amplifier is configured to receive an envelope supply voltage or a modulated supply voltage based on the envelope tracking pathway to ensure that operation is constantly adjusted so that the power amplifier is operating at a peak or maximum efficiency for a given instantaneous output power requirement. The power amplifier, for example, comprises a first input coupled to the envelope tracking pathway and a second input that is different from the first input, which is coupled to the main signal processing pathway. The second input, for example, can be for receiving an up-converted or down-converted signal that is derived from the signal processing of one or more input signals to the system (e.g., a radio frequency (RF) signal. an acoustic signal, or other communication input signal).

In one aspect, the envelope tracking path comprises a variable delay component that is configured to adjust a delay of the envelope tracking path to correspond with the main signal processing path. The delay is often set or calibrated during or at manufacturing. However, variations can occur from the initial calibration of the delay of the envelope tracking path with respect to the main signal processing path, such as from age, path interferences, process, voltage or temperature (PVT) dependencies, etc., for example. The delay element or delay component disclosed herein can be variably adjusted during an active transmission or active mode of the transmitter, receiver or transceiver so that the signals being received or transmitted can be processed with a dynamic delay mechanism that compensates for any offset, variation or differences from a pre-calibrated delay. Such variations in the delay component, and thus the corresponding delay of the envelope tracking path with respect to the main signal processing path, can generate inefficiencies and increase with aging effects, PVT dependencies, or other variations of the system or system components.

The delay component can be a calibrated or re-calibrated dynamically during an active mode when operating in working or field conditions after a manufacturing calibration or as an initial calibration during manufacturing as well. For example, the delay component can be fine-tuned or (re-)calibrated by means of a feedback path that comprises a feedback receiver, as well as with an in-band calibration signal, in which, for example, the calibration signal can comprise an amplitude or a peak amplitude that is lower than the input signals being received at the main signal processing path. In another aspect, the calibration signal (in-band calibration signal) can be added to the input signal (e.g., an RF signal, an acoustic signal, or the like) that is being received at the main signal processing path after branching from the envelope tracking path, and thus not included in the envelope tracking path. In another aspect, the calibration signal can be cross-correlated with an output signal of the PA, which is obtained from the feedback path, so that an optimum delay correction can be dynamically derived at a delay correction component located in the feedback path.

Accordingly, a delay of the envelope tracking path can be fine-tuned and calibrated for envelope tracking based on a feedback path signal and a calibration signal. The calibration signal, for example, can be selected to be at a lower amplitude than an input (e.g., RF input, or other like input signal) and also added to the main signal process path to the PA. Additional aspects and details of the disclosure are further described below with reference to figures.

Referring to FIG. 1, illustrated is an exemplary user equipment or mobile communication device 100 that can be utilized with one or more aspects of the PA systems or PA devices described according to various aspects. The mobile communication device 100, for example, comprises a digital baseband processor 102 that can be coupled to a data store or memory 103, a front end 104 (e.g., an RF front end, an acoustic front end, or the other like front end) and a plurality of antenna ports 107 for connecting to a plurality of antennas $106_1$ to $106_k$ (k being a positive integer). The antennas $106_1$ to $106_k$ can receive and transmit signals to and from one or more wireless devices such as access points, access terminals, wireless ports, routers and so forth, which can operate within a radio access network or other communication network generated via a network device. The user equipment 100 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 104 can include a communication platform, which comprises electronic components and associated circuitry that provide for processing, manipulation or shaping of the received or transmitted signals via one or more receivers or transmitters 108, a mux/demux component 112, and a mod/demod component 114. The front end 104, for example, is coupled to the digital baseband processor 102 and the set of antenna ports 107, in which the set of antennas $106_1$ to $106_k$ can be part of the front end. In one aspect, the mobile communication device 100 can comprise a PA system 110 that operates with a delay component for providing a delay between a main signal processing path and an envelope tracking path of a PA. The delay can be dynamically (re-)calibrated according to a feedback path from the PA output, for example.

The user equipment device 100 can also include a processor 102 or a controller that can operate to provide or control one or more components of the mobile device 100. For example, the processor 102 can confer functionality, at least in part, to substantially any electronic component within the mobile communication device 100, in accordance with aspects of the disclosure. As an example, the processor can be configured to execute, at least in part, executable instructions that control various modes of the PA system 110 as a multi-mode operation chipset that affords different power generation operations for input signals at the antenna ports 107, an input terminal or other terminal based on one or more characteristics of the input signal.

The processor 102 can operate to enable the mobile communication device 100 to process data (e.g., symbols, bits, or chips) for multiplexing/demultiplexing with the mux/demux component 112, or modulation/demodulation via the mod/demod component 114, such as implementing direct and inverse fast Fourier transforms, selection of modulation rates, selection of data packet formats, inter-packet times, etc. Memory 103 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 102 is functionally and/or communicatively coupled (e.g., through a memory bus) to memory 103 in order to store or retrieve information necessary to operate and confer functionality, at least in part, to communication platform or front end 104, the PA system 110 and substantially any other operational aspects of the PA system 110. The PA system 110 includes at least one power amplifier in the RF front end 104 that is an envelope tracking power amplifier in order to improve an efficiency or battery life of the mobile communication device 100.

Figure 2:
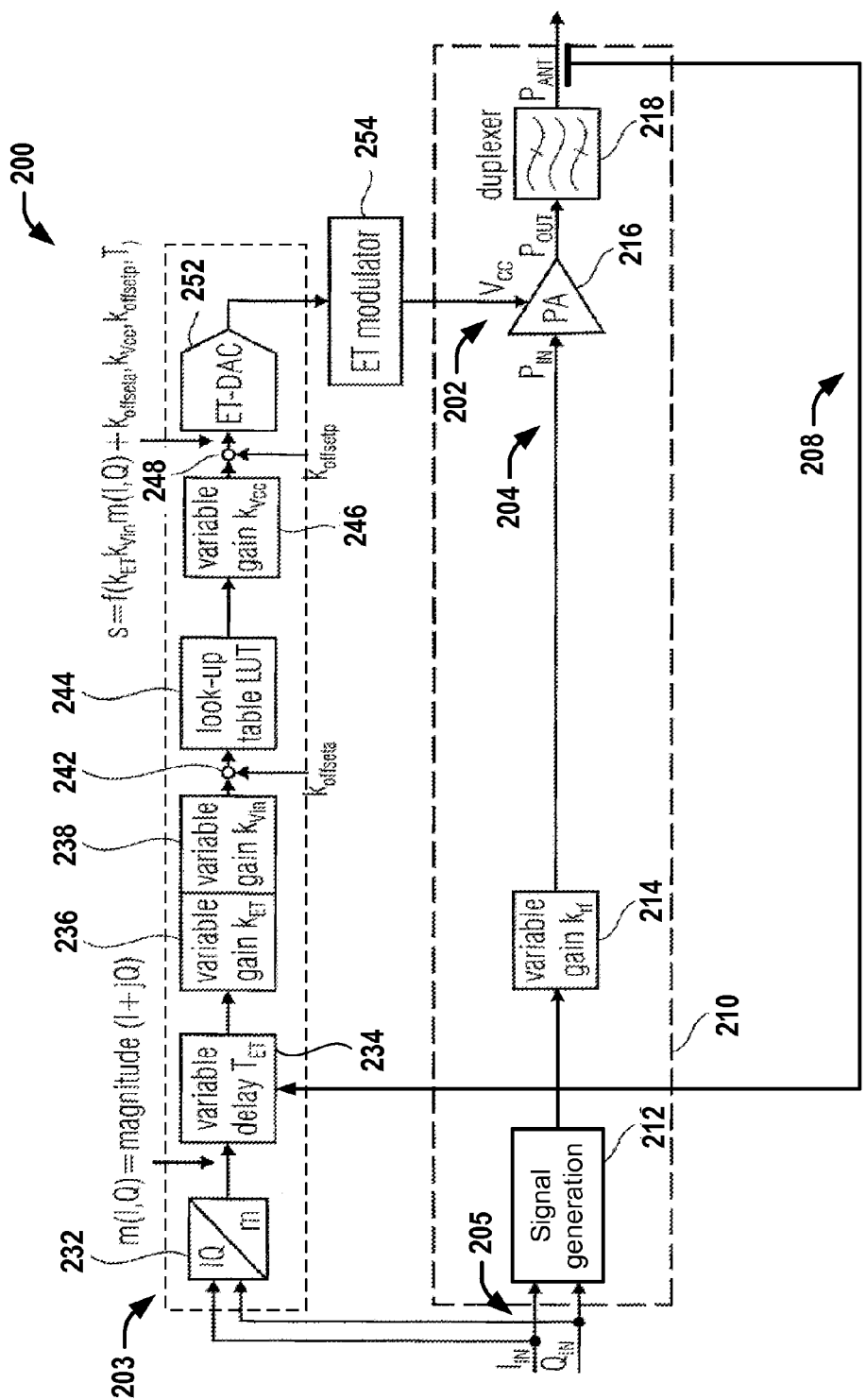
FIG. 2 is a block diagram illustrating another PA system or device according to various aspects described.

Referring to FIG. 2, illustrated is a schematic block diagram of an envelope tracking system 200 with a power amplifier 216 that has an input terminal 202 that is part of an envelope tracking pathway 203 and an input terminal 204 that is part of a signal generation pathway 210. An input terminal 205 or an input signal 205 (e.g., a differential signal, a single ended signal, an RF signal, an acoustic signal, or other like communication signal) to be processed or transmitted, can comprise, for example, an in-phase component $I_{IN}$ and a quadrature component $Q_{IN}$. Alternatively or additionally, the input signal 205 can comprise a different format as a single or a differential signal. The input signal 205 is received by a signal generation path 210 that comprises an RF signal generation component 212, a variable gain element 214, a power amplifier (PA) 216, and a duplexer 218. The signal generation component 212 can be configured to perform frequency up-conversion, for example, from a baseband (BB) frequency range to a radio frequency range, or generate a different conversion operation, such as a digital-to-analog conversion of the input signal 205. The variable gain element 214 is configured to multiply an output of the signal generation component 212 with a variable gain (e.g., $k_{rf}$) that serves to achieve a desired gain setting of the entire signal generation path 214 as part of the power amplifier system 200. The power amplifier 216 amplifies the signal provided by the variable gain element 214, wherein an input power of the PA 216 is $P_{IN}$ and an output power is $P_{OUT}$. The amplified amplifier output signal (Pout) is then fed to the duplexer 218, which separates transmitted and received signals in the frequency domain. At an antenna port of the duplexer 218, the output signal is typically slightly attenuated to an antenna power $P_{ANT}$, compared to the output power $P_{OUT}$ of the power amplifier 216.

One envelope tracking specific design target on a system level is a flat AMPM- and AMAM phase response of the PA 216 versus PA supply voltage $V_{CC}$ and across output power (in this context PA supply voltage $V_{CC}$ refers to the voltage that is influenced by an envelope tracking operation, for example, the supply voltage of a $2^{nd}$ PA stage). The abbreviation AMPM stands for "amplitude-to-phase distortion" and the abbreviation AMAM stands for "amplitude-to-amplitude distortion".

The lookup table 244 can be part of the envelope tracking path 203 or a supply voltage processing path, which is depicted above the main signal generation path 210. The supply voltage processing path 203 is also considered a part of the envelope tracking system 200. The supply voltage processing path 203 can comprise a vector-to-magnitude converter 232. The instantaneous magnitude of the input signal 205 can be expressed as m(I,Q)=magnitude(I+jQ), which is forwarded to a variable delay element 234 configured to delay the magnitude signal by a delay $T_{ET}$. The supply voltage processing path 203 further comprises a variable gain element 236 with a variable gain $k_{ET}$. The variable gain $k_{ET}$ can be synchronized with the variable gain $k_{rf}$ of the transmitter 210 (not explicitly shown in FIG. 2). At a summing element 242, an input signal offset $k_{offseta}$ is added before the signal is provided to a lookup table (LUT) 244. The lookup table 244 implements a nonlinear transfer function or at least the basic shape of the nonlinear transfer function. The supply voltage processing path 203 further comprises a further variable gain element 246 for applying a variable gain $k_{VCC}$ to an output signal of the lookup table 244. At a further summing element 248 an output signal offset $k_{offsetp}$ is added before the signal is digital-to-analog converted by an envelope tracking digital-to-analog converter (ET-DAC) 252. An analog output signal of the ET-DAC 252 is provided to the ET modulator 254 (e.g., ET DC-DC voltage provider) as a variable or dynamic control signal and to cause the ET modulator 254 to provide a corresponding supply voltage $V_{CC}$ to the envelope tracking power amplifier 216 for providing an output voltage or output power signal at a maximum efficiency.

The delay of the delay component 234 can be sensitive to part-to-part variations along the main signal processing path 210 and the envelope tracking path 203, as well as to aging and PVT dependencies, for example. Therefore, the delay is calibrated during production of the power amplifier system 200 or of a communication device/transmitter/receiver/transceiver that comprises the power amplifier system 200. In one aspect, re-calibration is dynamic and can be facilitated by the power system 200 after production on-the-fly or in real-time during an active transmission or during active communications of the device in the field during an active transmission mode or an active mode of operation in order to compensate for the aging effects, PVT dependencies, or other variations.

In some instances, the variable delay may only be calibrated once during factory calibration for a 50 ohm termination. However, factory calibration has different limitations as follows: (1) the delay might change over time, and (2) the factory calibration process does not fully reflect real-life use cases of a mobile device (e.g., the antenna impedance does change depending on the position of the mobile communication device relative to the mobile device user). Antenna impedance change can also affect the PA behavior (e.g., for some antenna impedances the PA supply $V_{CC}$ has to be increased to maintain antenna output power and for other antenna impedances the PA supply Vcc needs to be decreased to reach the same output power). As a result, the actual delay or actual delay function of the delay component 234 is subject to deviate from a target delay that was established during factory calibration in a calibration mode, for example, which is different from an active transmission mode in the field or thereafter. As such, these variations can cause degradation of an adjacent channel leakage ratio (ACLR) or an error vector magnitude (EVM) performance, for example. These conditions discussed above can be mitigated or avoided by dynamically re-adjusting the delay or the delay function of the delay component $T_{ET}$ 234 according to various aspects described.

Several measures can be carried out to compensate possible delay changes. The power amplifier system 200 can perform dynamic calibration or setting of the delay component 234 in the envelope tracking path 203 according to 1) a re-calibration during an active transmission or an active power generation mode of the power amplifier during operation, 2) on-the-fly re-calibration without interfering with the information inherent in the received input signal 205 (e.g., an RF signal, acoustic signal or the like), 3) on-the-fly re-calibration without violation of the spectral mask of the input signal 205, or re-calibration as a function of a feedback path 208, as well as of a calibration signal.

The feedback path 208 can be coupled to an output of the PA 216 at $P_{out}$, for example, or, as illustrated, coupled to an output of a duplexer 218 at $P_{ANT}$. The delay component 234 can thus operate to dynamically adjust or modify the delay with respect to the main signal processing path 210 based on an output of the PA 216 during an active use, active transmission mode or an active operation mode, which can be other than a factory calibration mode, for example, before field use. The delay component 234 can adjust a delay or delay function according to a correctional value that modifies a deviation of an actual delay from a target delay. The correctional value can be derived from a feedback path signal and a calibration signal received by a delay correctional component. The calibration signal, for example, can be selected to have a lower amplitude than the input signal 205 received by the system at an in-band frequency. In addition, the calibration signal can be provided to the main signal processing pathway 210 and to the feedback path 208, as further detailed below.

Figure 3:
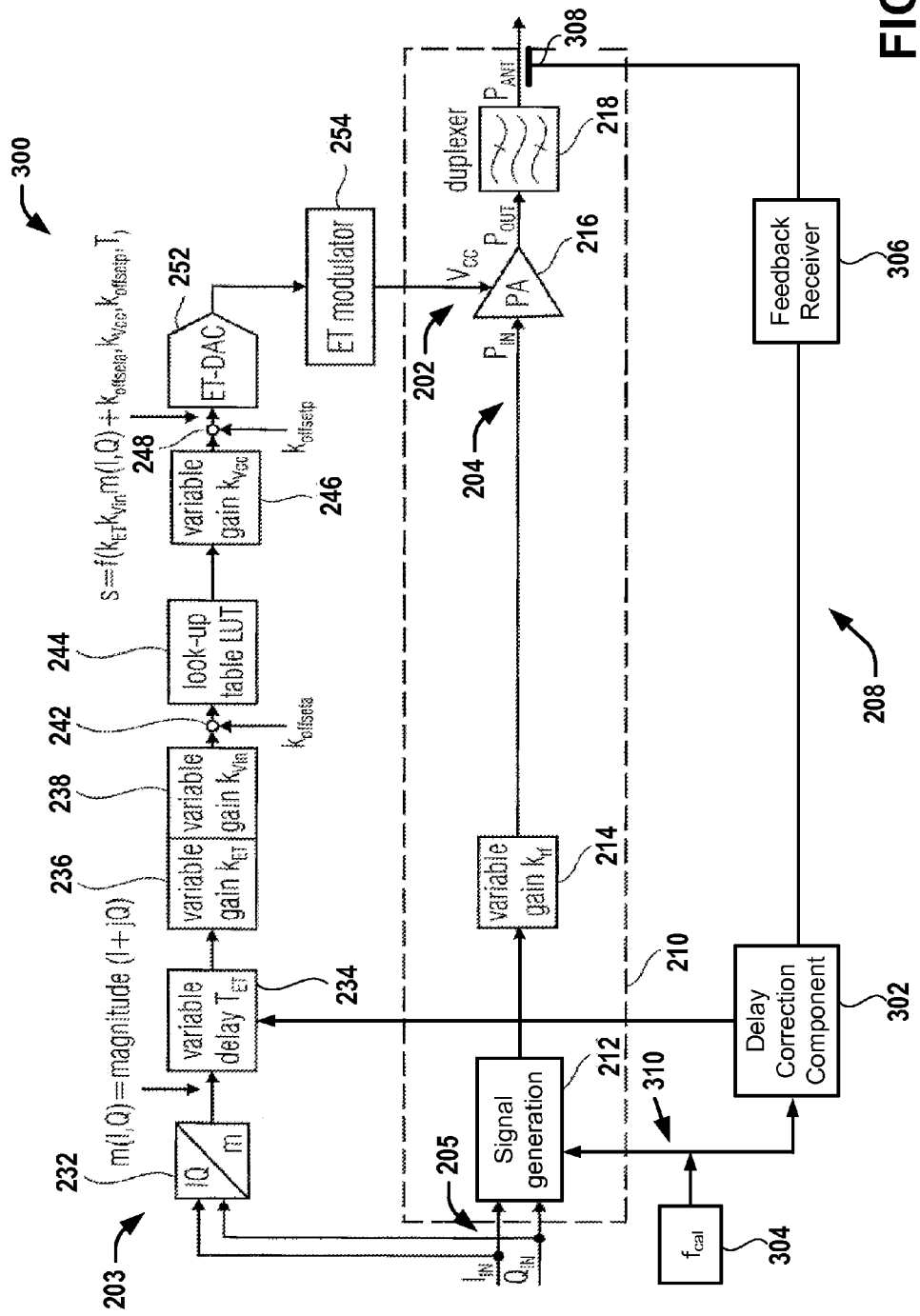
FIG. 3 is a block diagram illustrating another PA system or device according to various aspects described.

Referring now to FIG. 3, illustrated is an example of a power amplifier system 300 that dynamically modifies the delay between a main signal processing pathway and an envelope tracking pathway in accordance with various aspects being described. The power amplifier system 300 includes similar components as discussed above, and further comprises a delay correction component 302, a calibration component 304, and a feedback receiver 306.

The feedback receiver 306 can be coupled within the feedback path 208 at an output terminal 308 of the PA 216 or at an output of the duplexer 218 downstream of the output terminal of the PA 216. The feedback receiver 306 receives the output signal (e.g., $P_{ANT}$) via the feedback path 208 and generates a feedback signal based on the output signal $P_{ANT}$. The feedback receiver 306, for example, can be configured to shape one or more of delay parameters as a function of the power output signal or a voltage $V_{ANT}$. The feedback receiver 306 is thus utilized for generation of a closed-loop power control of the delay, via the delay correction component 302, to dynamically adjust the delay of the delay component 234 by generating a feedback signal (e.g., $V_{FBR}$ or the like) based on the output 308 of the power amplifier 216 and provide the feedback signal to the delay correction component 302. Alternatively or additionally, the feedback signal can be implemented in an open-loop configuration, in which a separate component or a memory storing one or more parameters of an output of the PA 216 could also be provided separately or externally to the delay correction component 302 to derive a correctional value to the delay function of the delay component 234.

The feedback receiver 306 can comprise a receiver device that detects signals at the output 308 of the PA 216 or at the duplexer 218 and processes the signals for further communication or transmission of at least a signal parameter, a property of the signal or the other signal component. The feedback receiver 306 operates to apply the signal generated from the output 308 to an input terminal of the delay correction component 302, for example. The feedback receiver 306 can operate, for example, as a receiver, transmitter or transceiver device within the feedback path 208. The feedback receiver 306 can convert at least a portion of the output 308 or a property of the output 308 from an analog signal to a digital signal. In one example, the feedback receiver 306 can generate the feedback signal in a vector representation, for example (in-phase component $I_{FBR}$ and quadrature component $Q_{FBR}$), and further shift at least a portion of the vector representations into, or by, an amplitude and a phase, such as from one coordinate system to another (e.g., polar coordinates, or the like), or other operation (e.g., a temporal operation, a spatial operation, an offset by a gain, etc.). The feedback receiver 306 can further provide the processed signal based on the output signal of the output terminal 308 to an input terminal of the delay correction component 302.

The delay correction component 302 is configured within the feedback path 208 to generate a correction or correctional value based on the feedback signal that is received at an input coupled to the feedback receiver 306 or a calibration signal $f_{cal}$. The delay correction component 302 outputs the correction value at an output terminal connected to the variable delay 234. The correction value can operate to correct a deviation of an actual delay of the delay component from a target delay, such as from device aging or PVT dependencies, which can include variation effects on system, pathway, component, structural functions or the like within the system 300 that alter or vary objective functioning (e.g., a delay of the ET path 203 with respect to the main signal path 210).

The delay correction component 302 can further be configured to generate the correction value as a variable parameter that resets a calibration of the variable delay component/element 234 to a different setting for permanent or temporary operation based on the corrected parameter. The delay correction component 302 and the feedback receiver 306 can both operate at or during an active transmission, an active operating mode, or be initiated, for example, by the detection of a power output at an output terminal 308, and be in response to a period of time or instantaneously operate as a function of one or more criteria. As such, the delay element 234 can be dynamically adjusted continuously or at different periods by which a variation in the actual delay from a target delay exceeds or satisfies a predetermined threshold. The correction value or correctional delay can serve to reset the calibration, as discussed above, or can operate to modify a setting or a calibration of the delay element 234 so that a delay of the delay element 234 is varied to accommodate for a predetermined difference of delay between the envelope tracking path 203 and the main signal processing path 210. In addition or alternatively, a variable of a delay function can be set or defined by the delay element 234 based on the correctional value, or can be modified by the correctional value so that a delay of a received signal via the input 205 to the delay component or the magnitude components generated within the path 203 are delayed with respect to a variable of the main signal path 210.

Furthermore, the delay correction component 302 is configured to receive a calibration signal and a feedback signal at one or more input terminals of the feedback path 208, and generate a correction(al) value/function or an adjustment signal to the delay element 234 based on or as a function of the feedback receiver output and a separate calibration signal ($f_{cal}$). The calibration signal can be externally generated and provided, for example, via a calibration communication path 310, stored in a memory of the calibration component 304, or generated dynamically based on application conditions of the system 300 as an acoustic transmitter, an RF transmitter, other device or as a device used as one type of communication device or another based on different signals (e.g., input signals of input terminal 205) or types of signal protocols at the input 205 that demand different power ranges and transmission powers for the PA 216, for example. Thus, in one aspect, the calibration component 304 can provide the calibration signal as a calibration terminal from a memory or external communication link, or generate the calibration signal dynamically as a function of an application parameter or condition of use, such as based on a frequency, channel, or bandwidth of the input signal 205 or other criteria as discussed herein.

The calibration component 304 is configured to provide the calibration signal as an in-band calibration signal (e.g., a sine wave, metadata, control information signal within a same band or channel as the input signal 205, or other channel). Additionally, the calibration signal can be generated or provided at an amplitude that is lower amplitude than the input signal 208. The calibration component 308 can thus generate the calibration signal while preserving the spectral mask of the input signal 208 and without a data violation or additional interference being caused by the calibration signal $f_{cal}$. In one example, the calibration signal is provided via the calibration path 310 to an input terminal of the delay correction component 302 and at a point in the main signal processing/generation path 210 that is after the envelope tracking path 203. Thus, the calibration signal can be processed with the input 205 via the main signal processing path 210 and via the feedback path 306 without being processed or communicated via the envelope tracking path 203.

In another aspect, the calibration component 304 can provide the calibration signal to the delay correction component 302 and concurrently provide the calibration signal to the signal generation component 212. The delay correction component 302 generates a correction of the actual delay of the delay element 234 based on the feedback receiver signal of the feedback receiver path 208 and a calibration signal from a calibration path 310. The signal generation component 212 can thus operate to convert the input signal 205 to a converted signal (e.g., an up-converted signal) for processing via the main signal processing path 210 to the PA 216 based on the calibration signal also, while the correction value/function or a correctional signal is also generated based on the calibration signal via the delay correction component 302.

Figure 4:
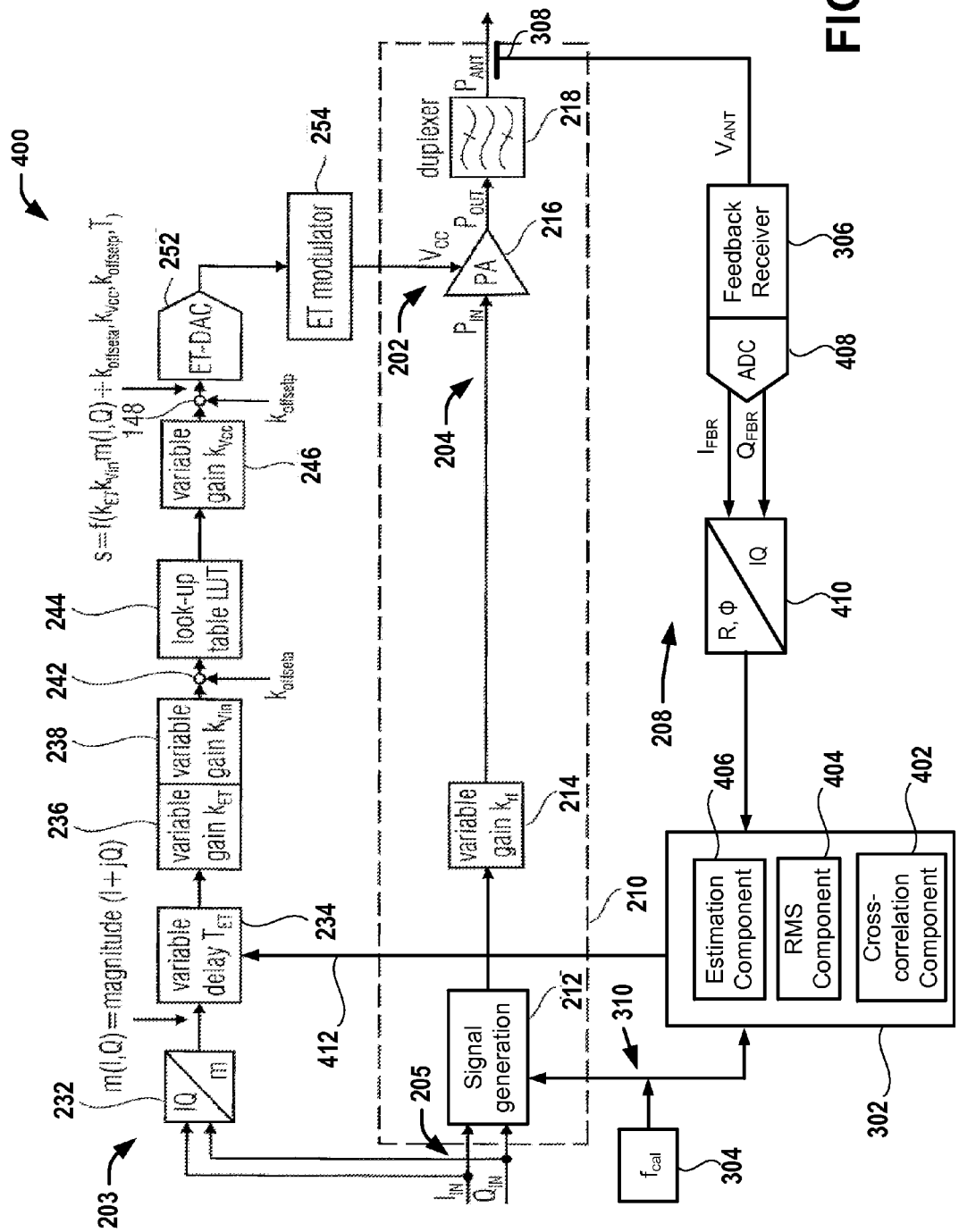
FIG. 4 is a block diagram illustrating another PA system or device according to various aspects described.

Referring now to FIG. 4, illustrated is another example of a power amplifier system 400 in accordance with various aspects disclosed. The power amplifier system comprises similar components as discussed above and further comprises a cross-correlation component 402, a root-mean-squared (RMS) component 404, an estimation component 406, an analog-to-digital converter 408, and a data shifter 410.

During an active transmission, or an active mode of operation during a transmission of one or more processed received input signals (e.g., RF signals for RF transmission, acoustic signals, or the like), calibration processes can be applied to the delay element component 234, which can be coupled within the envelope tracking path 203, for example. The calibration processes, as discussed above, can operate to vary or modify the delay element component 234 based on a correctional value or correction signal that is derived via the delay correction component 302 in conjunction with the feedback signal path 208 and the calibration path 310.

The delay element component 234 can operate to generate a delay in order to correspond to a timing association in the signal processing between the main signal processing path 210 and the envelope tracking processing path 203, for example. As such, the PA 216 can generate an optimum or an efficient power as an envelope tracking power amplifier 216 that generates an output power generation of a modulated input signal as a function of supply voltage based on an envelope (e.g., a function of a set of signal extremities) of the input 205. The delay correction component 302 generates the correction signal 412 to the variable delay element component 234 to (re-)calibrate the delay function or a delay value thereat during an active transmission of signals in the system 400, on-the-fly without interfering with information that is inherent in the input signal 205, on-the-fly without violation of a spectral mask of the input signal 205, and based on a feedback receiver output and a calibration frequency or calibration signal.

In one aspect, the delay correction component 302 is configured to cross-correlate the calibration signal received via the calibration path 310 and a feedback receiver signal (e.g., a voltage feedback receiver signal or $V_{FBR}$), in order to generate, via the cross-correlation component 402, a cross correlated signal as a function of a delay variable or over different delays being implemented over a period of time. The delay correction component 302 further generates an RMS value or RMS signal, via the RMS component 404, of the cross-correlated signal. The delay correction component 302 further operates to generate a maximum value of a cross-correlation function based on the RMS value or RMS signal of the cross-correlation function over one or more different delays, which can be estimated by the estimation component 406 and used as the correction value or correction signal. This correctional signal can then be provided, via the delay correctional component 302, to the delay element component 234 for a modification of a delay setting or a delay function for delay generation of the ET pathway 203 with respect to the main signal path 210.

The cross-correlation component 402, for example, cross-correlates or generates a cross-correlation of the calibration signal received via the calibration path 310 with the feedback signal that is received via the feedback path 208. The cross-correlation generated can be a measure of a similarity between at least a portion of the different signals received (e.g., the calibrated signal and the feedback receiver voltage signal), which, for example, can be a function of a time-lag applied to one of them or over different delays. The cross-correlation can be a sliding dot product or sliding inner-product, for example, that identifies similar portions between at least two waveforms, waveform variables, or probability functions of the two different paths, namely the feedback path 208 and the calibration path 310. The cross-correlation component 402 further provides the result as a cross-correlation function (e.g., $X_{CORR}=f(T_{ET})$), a cross-correlation value or cross-correlation signal to the RMS component 404.

The RMS component 404 is configured to generate a root-mean-squared value of the cross-correlation output received from the cross-correlation component 402. For example, the cross-correlation function (e.g., $X_{CORR}=f(T_{ET})$) can be processed to generate a $X_{CORRrms}=f_{rms}(T_{ET})$ cross-correlation RMS function or value as a magnitude of a varying quantity in the correlated function.

The estimation component 406, for example, is configured to generate a maximum root mean squared value based on a comparison of the at least one additional root mean squared value and the first root mean squared value, which can be derived over different delays, which can occur as the system ages or over different variations occurring over time, for example. The delay correction component 302 thus operates to adjust a delay or delay function of the delay element component 234 based on the maximum root mean squared value selected via the estimation component 406.

In another aspect, the estimation component 406 operates to generate peak values associated with a first root mean squared value and the at least one additional root mean squared value, provided via the RMS component 404, of the cross-correlation function respectively. The estimation component 406 further selects a peak value or other value of the range of values at different implemented delays, for example, that satisfies a predetermined threshold to adjust the first delay. For example, a peak value or function that can be determined by a peak detection operation of the estimation component 406 can be selected based on whether a peak, maximum or other predetermined threshold value is satisfied by a predetermined condition, for example. Alternatively or additionally, a maximum of different iterations can be selected as the correctional value or correctional function to be signaled to the delay element component 234 to facilitate (re-)calibration of the delay function generated thereat. In another aspect, a maximum function of the cross-correlation RMS function over different delays, or of a power output 308 of the PA 216 or duplexer 218, which can be first normalized as estimates for comparison, can be selected to be provided as a correction function to the delay element component 234. The selection can be based on a satisfaction of a predetermined threshold with respect to a predetermined condition of a parameter, a maximum value or a peak value as generated by the peak detection processes of the estimation component 406.

Figure 5:
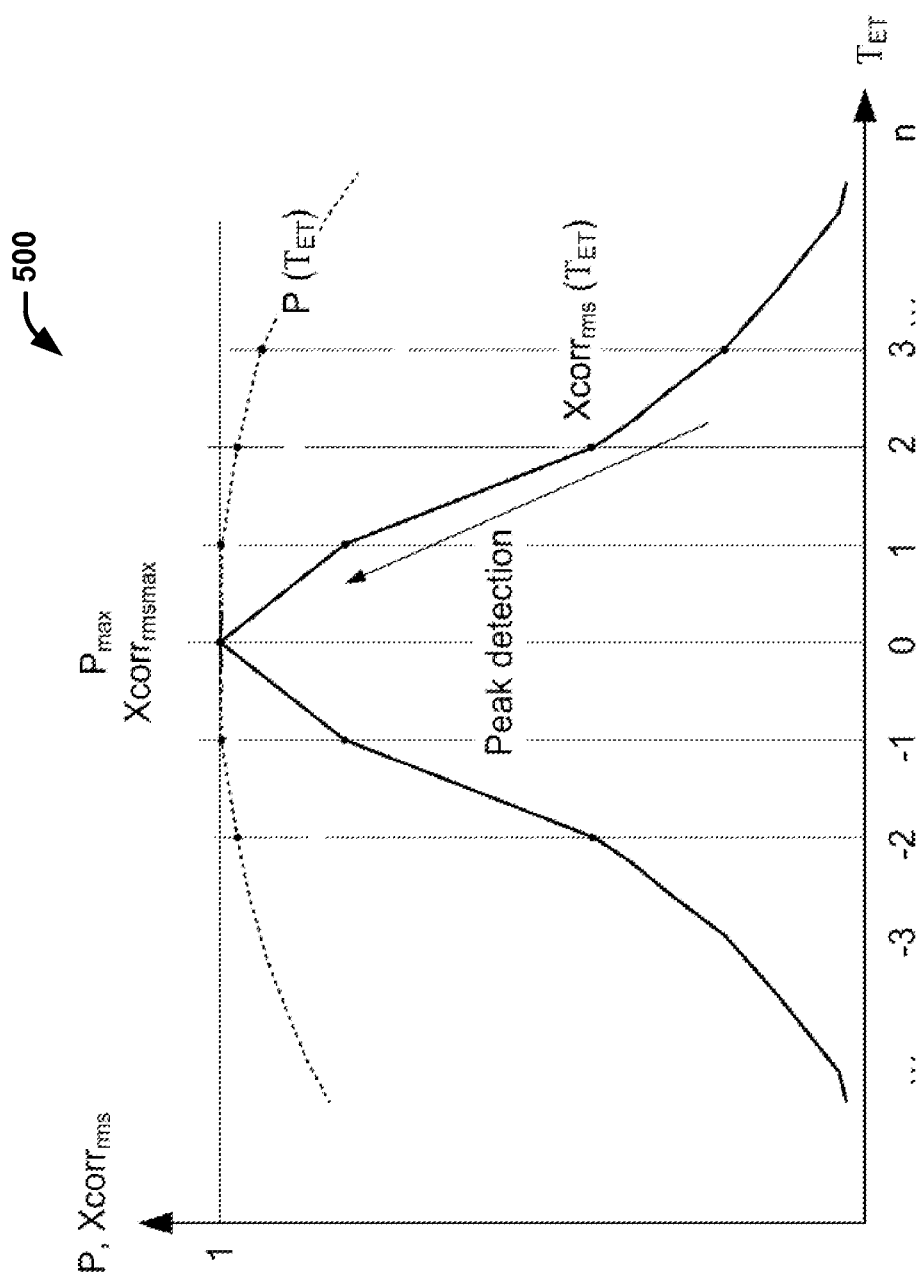
FIG. 5 is a graph illustrating normalized values of a cross-correlation function with respect to a range of delays according to various aspects described.

Referring to FIG. 5, illustrated is an example of plotted values from a cross-correlation function with respect to different delays in accord with various aspects described. The cross-correlation component 402 can generate a cross-correlation of the calibration signal ($f_{cal}$) and the feedback receiver signal (e.g., $V_{FBR}$), and can generate different functions as a result of the cross-correlation of different delays ($T_{ET}$) over time, in which a deterioration of the calibrated delay can result from aging or other system variations (e.g., PVT variations, etc.). An example of these different functions is illustrated in the graph 500. In addition, the cross-correlation component can operate to cross-correlate a feedback signal derived from the output from the duplexer 218, from the output from the PA 216 directly, or another output or output signal parameter of the system (e.g., PA device, transmitter, transceiver, etc.) and the calibration signal ($f_{cal}$) to generate the plots of different functions as illustrated.

The delay correction component 302, for example, generates values of a cross-correlation function with respect to different delays of the delay component 234, generates an RMS value of each, and further obtains, plots or selects a delay value or function that is higher than additional values or functions of the set of values or functions obtained to update or adjust the delay element component 234, such as illustrated in the graph 500. Additionally or alternatively, the delay value or function that satisfies or exceeds a predetermined threshold can be selected as the control to modify the delay component 234 according to a set of criteria, which can include parameters related to the input signal, the PA 216 (e.g., variation in output from demand, age, PVT, etc.), or other components of the system in order to provide an efficient and dynamic delay mechanism for at least two paths (e.g., the envelope tracking path 203 and the main signal processing/generation path 205).

For example, the graph 500 demonstrates different plots of normalized RMS values, for example, over different envelope tracking path delays ($T_{ET}$) generated via the variable delay element component 234. The delay correction component 302, via the estimation component 406, can operate to select a maximum thereof from an estimation or peak detection process to further control or modify the delay element component 234 accordingly. The plots of graph 500 illustrate a comparison that can be generated by the estimation component 406 in order to estimate the optimum normalized estimate of one or more RMS values of the cross-correlation function. A power function from the output of the PA 216 is illustrated as $P(T_{ET})$ and a $X_{CORRrms}(T_{ET})$, in which each can be normalized with respect to on another, are illustrated as a function of different delays along the y-axis and normalized values of each function along the x-axis. As another example, the different functions of the values plotted can be from the same output or as Xcorr at different periods as well as over different delays or other variables (e.g., input signal parameters or types). The estimation component 406 can further perform a peak detection process from one or all of the functions and obtain/estimate a maximum value such as from $P_{max}$, $Xcorr_{rmsmax}$ or the like. The maximum value or a value that corresponds to the maximum value can be selected via a look up table. The value or a function thereof can then be provided to the delay component 234 via the delay correction component 302 as a control signal for (re-)calibration of the delay element component 234, for example.

Figure 6:
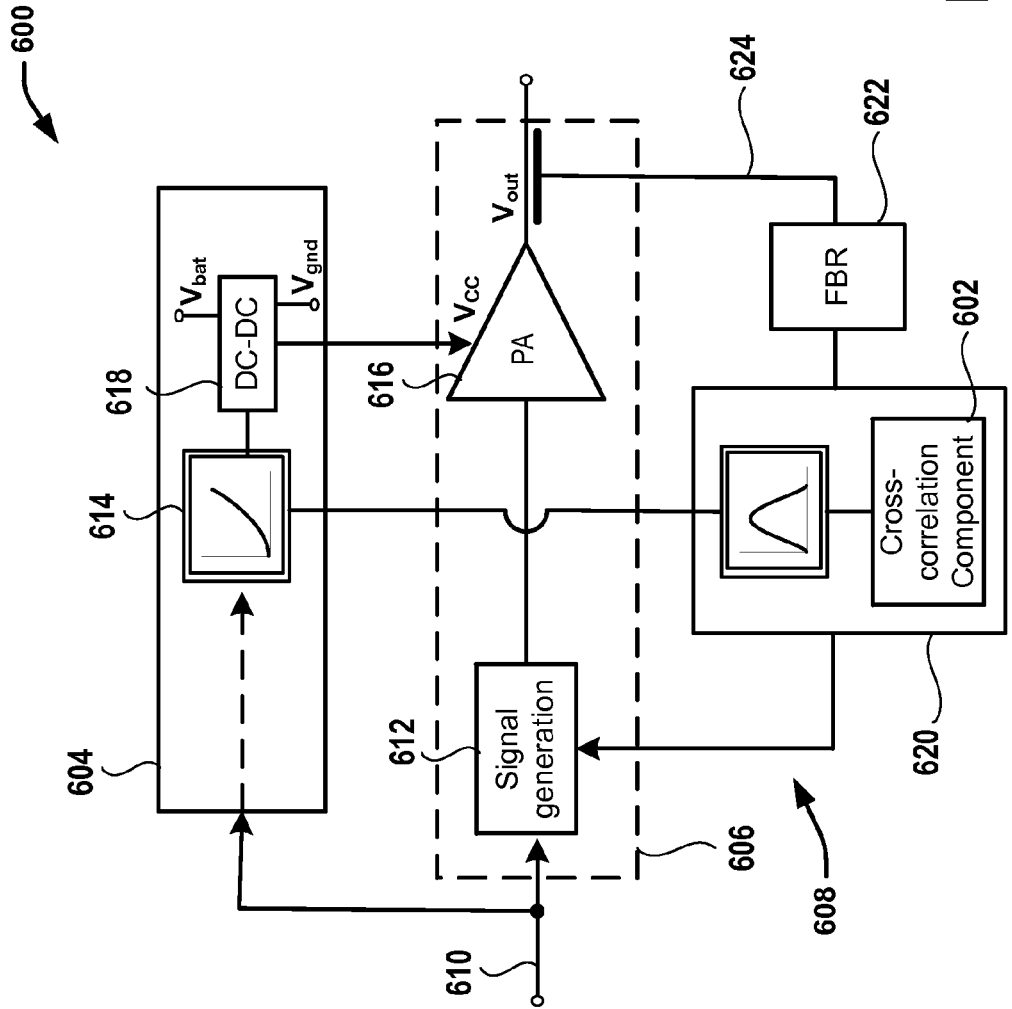
FIG. 6 is a block diagram illustrating another PA system or device according to various aspects described.

Referring now to FIG. 6, illustrated is another example envelope tracking system or PA system 600 that comprises an envelope tracking path 604 and a main signal generation/processing path 606, which are coupled to an input terminal 610 of the system 600 for receiving an input signal (e.g., a wireless communication signal, LTE, 3GPP, RF, acoustic, etc.) and to an input terminal of the PA 616. The PA 616 can comprise an envelope tracking power amplifier 616, for example.

The envelope tracking path 604 comprises a separate forward communication path or pipeline that processes an input signal 610 for modulation of a variable supply voltage to the PA 616 via a variable supply voltage provider 618. The envelope tracking path 604 comprises the supply voltage provider (e.g., an ET DC-DC) 618, in which the supply voltage provider 618 can operate as a modulator to modulate a battery voltage (Vbat) thereat and supply a modulated voltage to the PA 616 for operations. The supply voltage provider 618 is coupled to a delay component 614 (e.g., a variable delay component) within the envelope tracking path 604, which operates to facilitate a delay within the envelope tracking path 604 with respect to or as a function of the processing time of the main signal processing/generation path 606. The main signal processing path 606 comprises a signal generation component 612 that processes the input signals to the PA 616 in an active transmission mode of operation for communication (e.g., via an antenna or other component).

The system 600 further comprises a feedback path 624 that includes a feedback receiver (FBR) 622 and a delay correction/control component 620. The feedback receiver 622 is configured to receive an output signal of the envelope tracking power amplifier 116 and provide a corresponding feedback signal to the delay correction/control component 620. The output signal (e.g., $V_{out}$) of the envelope tracking power amplifier 616 is also provided to an output terminal of the envelope tracking system 600 via the PA 616 or a duplexer coupled thereto. The delay correction/control component 620 is configured to receive a calibration signal and the feedback signal, and determine a correctional value signal based on a cross-correlation between the different signals. The delay correction/control component 620 can determine a target performance or target delay of the envelope tracking power amplifier 116, or the delay component 614, and determine an actual performance or actual delay of the envelope tracking amplifier 116, or the delay component 614. The actual performance delay can be determined based on the feedback signal.

In an aspect, the correctional value can be determined from a maximum value or other predetermined threshold of a predetermined condition being satisfied that is of the cross-correlation function over different delays based on the calibration signal and the feedback receiver output. The calibration signal can be received by, or generated by, the delay correction/control component 620, and further provided to the signal generation component 612 via path 608 from the delay correction/control component 620 to the signal generation component 612. The calibration signal can be an artificially introduced operator/interferer, for example, as a sine wave or other waveform for calibration operations and comprise a lower amplitude than the input signal 610 (e.g., an RF or other input) that is at an in-band frequency, for example. By means of the output of the feedback receiver 622, the delay correction/control component 620 generates, via cross-correlation component 602, the cross-correlation of the feedback receiver signal and the calibration signal (e.g., $f_{cal}$), which can be provided to the delay correctional component 620 and to the signal generation component 612. The delay correction/control component 620 utilizes the cross-correlation generated as a measure for the optimum delay alignment for the delay component 614, in which misalignment results in an inefficient delay between the envelope tracking path 604 and the main signal path 606 and a lower cross-correlation. The delay correction/control component 620 then controls a parameter of the delay function of the delay component 614 for better efficiency and timing of the system 600.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 7:
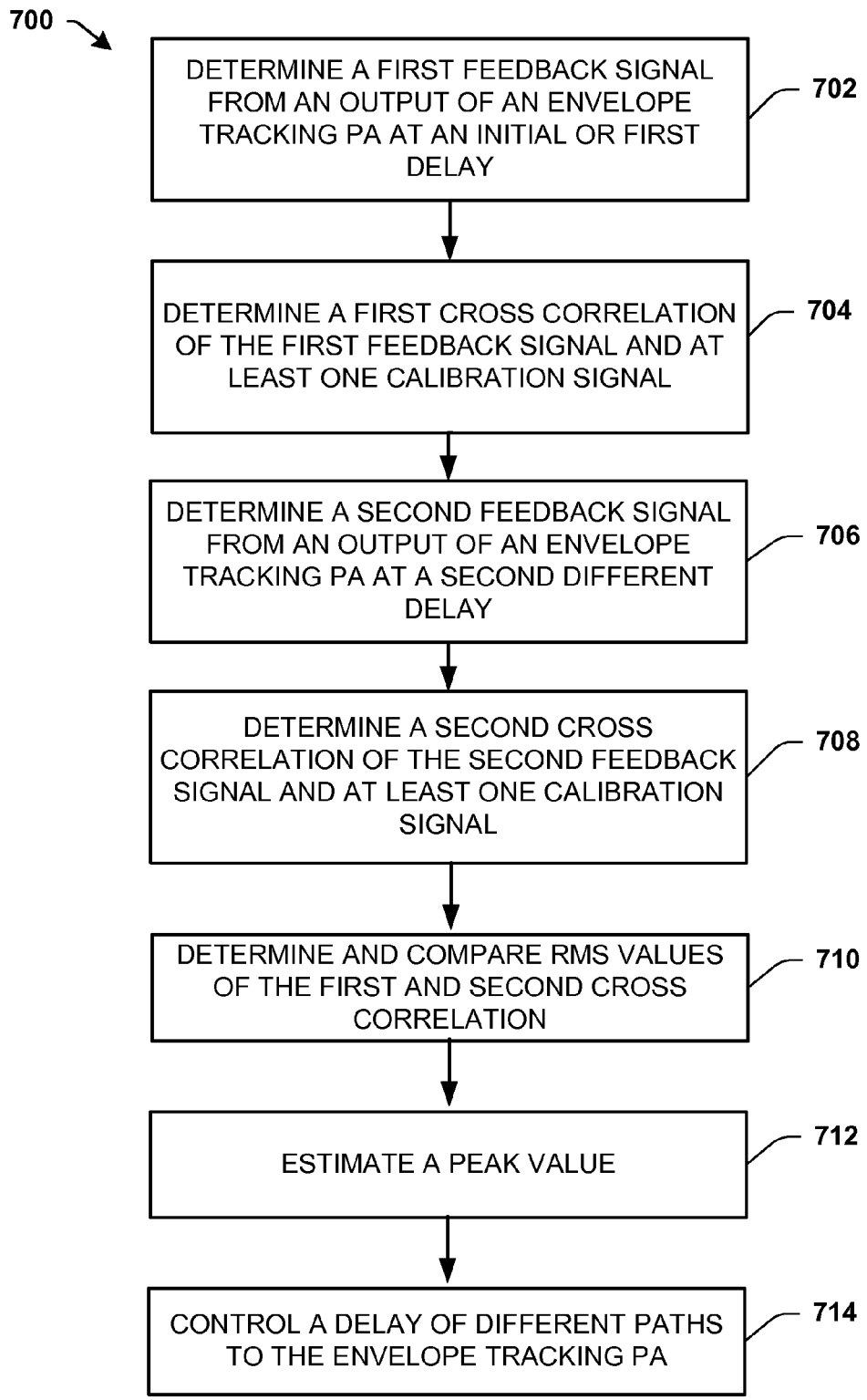
FIG. 7 is flow diagram illustrating a method of a PA system or device according to various aspects described.

Referring to FIG. 7, illustrated is a method 700 for (re-)calibration or fine tuning of a delay in a system that generates an output power for communications, such as in a transmitter or receiver of a communication device, for example. The method 700 initiates at 702 with determining a first feedback signal (e.g., feedback receiver signal $V_{FBR}$) by a measurement of a PA output during an active transmission of a transmission or communication device at an initial or a first delay (e.g., ET delay $T_{ET0}$).

At 704, a first cross-correlation of the first feedback signal and a calibration signal is generated.

At 706, a second feedback signal from an output of an ET PA at a second delay is generated during an active transmission at second different delay (e.g., ET delay $T_{ET1}$ as a slight higher or lower delay).

At 708, a second cross-correlation of a second feedback signal and a calibration signal is generated.

At 710, RMS values of the cross-correlations are determined (e.g., $Xcorr_{rms0}$, $Xcorr_{rms1}$), and the RMS values are compared to one another. A delay value of the higher RMS, for example, of the cross-correlation function can be used as an updated or modifier to the delay component of the ET path of the PA.

At 712, a peak detection algorithm can be performed on the cross-correlation functions or values, or the RMS values of the cross-correlation functions.

At 714, a delay of the different PA paths (e.g., ET path and main signal path) to the ET PA can be controlled. For example, a maximum RMS value $Xcorr_{rmsmax}$ of the cross-correlation function can be estimated and the result utilized to adjust or modify the delay (e.g., $T_{ET}$), for example at a delay component.

Figure 8:
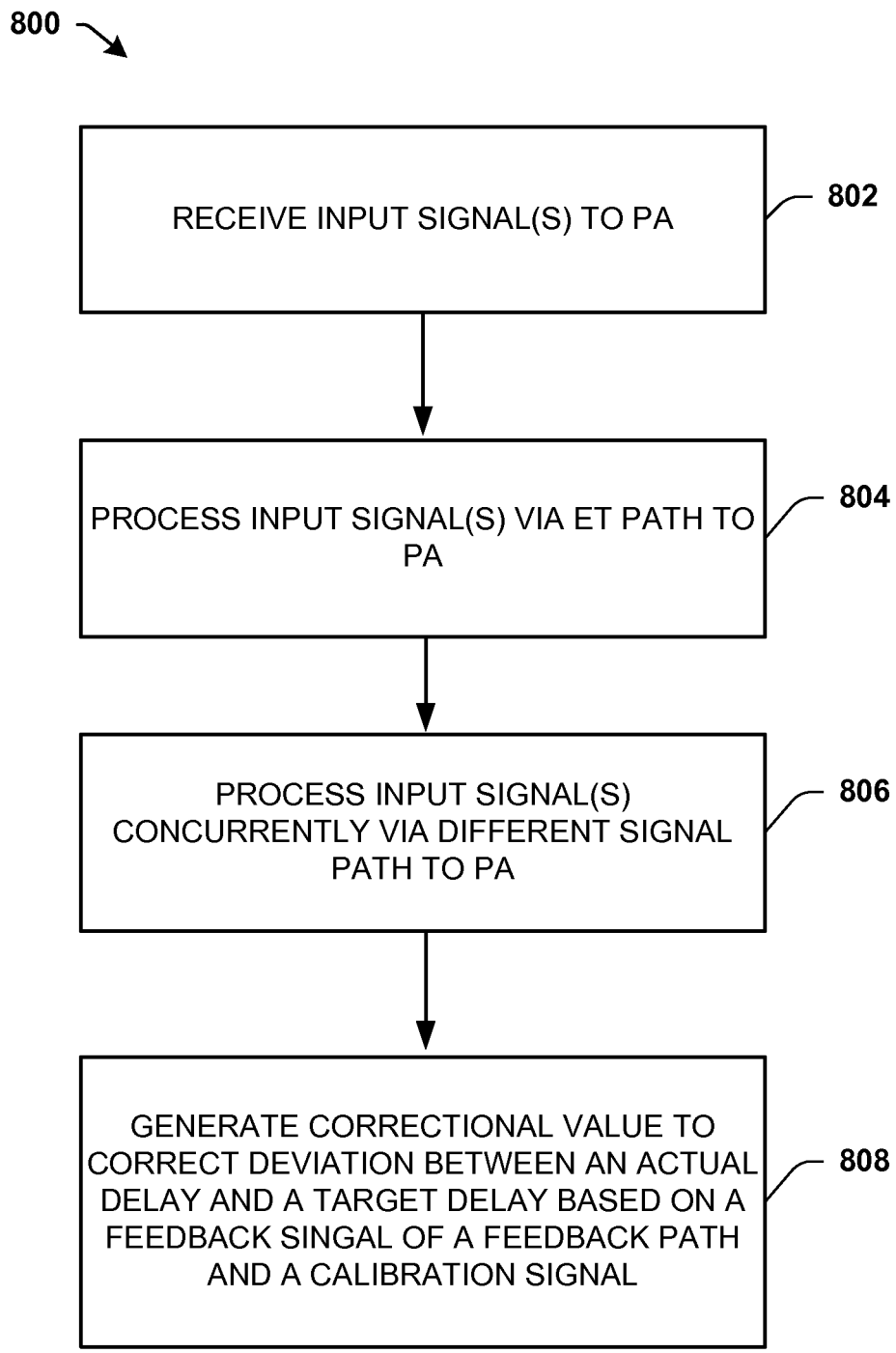
FIG. 8 is flow diagram illustrating a method of a PA system or device according to various aspects described.

Referring to FIG. 8, illustrated is a method 800 for (re-)calibration or fine tuning of a delay in a system that generates an output power for communications, such as in a transmitter or receiver of a communication device, for example. The method 800 initiates at 802 with receiving a plurality of input signals at an input terminal of a power amplifier system.

At 804, the method includes processing the plurality of input signals via an envelope tracking path to supply a variable voltage supply to a power amplifier based on an envelope of the plurality of input signals.

At 806, the method further comprises processing the plurality of input signals to a plurality of transmission signals via a signal processing path to the power amplifier.

At 808, the method comprises generating a correctional value that corrects for a deviation between an actual delay of the envelope tracking path with respect to the signal processing path and a target delay, as a function of a feedback signal provided in a feedback path from an output of the power amplifier to the envelope tracking path.

The method can further comprise generating the correctional value as a function of the feedback signal and a calibration signal at a calibration input. The calibration signal can be provided during an active transmission mode or a calibration mode of the power amplifier system to the plurality of input signals and the feedback signal. Processing the plurality of input signals to the plurality of transmission signals comprises generating the plurality of transmission signals based on the plurality of input signals and the calibration signal. The calibration signal, for example, can be selected with a sufficiently low amplitude, which is lower than the input signal (e.g., RF input or other type signal) to the system and at a frequency that is at the edge of the input signal band in order to not violate the spectral mask, such that coding and spreading operations of the input signal (e.g., via the signal processing/generation path or the like for communications) is applied to only the transmitted input signals and not to the added calibration signal and there is no further interference at the receiver, for example.

The method 800 can further comprise generating a plurality of cross-correlation functions based on a calibration frequency, the feedback signal at the actual delay during an active operation of the power amplifier system and at least one additional feedback signal during the active operation of the power amplifier system. At least one of the plurality of cross-correlation functions or values can be selected based on a set of predetermined criteria and the actual delay based on the correctional value can be derived via the delay component, for example, from the at least one of the plurality of cross-correlation functions or values thereof. For example, the set (one or more) of predetermined criteria can comprise root mean square value or a maximum root mean squared value that is selected based on a comparison of the plurality of cross-correlation functions.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is an envelope tracking system, comprising a transmitter configured to generate an output signal. An envelope tracking path is configured to adaptively generate a supply voltage varies based on an instantaneous envelope signal derived from an input signal. A signal processing path is configured to generate a converted signal via a signal conversion of the input signal and provide the converted signal to a power amplifier. A delay component is configured to generate a first delay of the envelope tracking path with respect to a second delay of the signal processing path, the first delay being tunable and based on a feedback signal of a feedback path that is derived from the output signal.

Example 2 includes the subject matter of Example 1, wherein the delay component is further configured to modify the first delay of the envelope tracking path based on the feedback signal and a calibration signal received during an active transmission of the transmitter.

Example 3 includes the subject matter of any of Examples 1 and 2, including or omitting optional elements, further comprising a feedback receiver, located in the feedback path, configured to generate the feedback signal derived from the output signal during an active transmission of the transmitter, and a cross-correlation component configured to generate a cross-correlation function of an in-band calibration signal based on the feedback signal of the feedback path from the feedback receiver, wherein the feedback path, the envelope tracking path and the signal processing path are coupled to different terminals of a power amplifier.

Example 4 includes the subject matter of any of Examples 1-3, including or omitting optional elements, further comprising a feedback receiver, located in the feedback path, configured to generate the feedback signal derived from the output signal at the first delay during an active transmission of the transmitter, and a second feedback signal derived from the output signal that is at a higher or a lower delay than the first delay during the active transmission of the transmitter.

Example 5 includes the subject matter of any of Examples 1-4, including or omitting optional elements, further comprising a root mean squared (RMS) component configured to generate a first root mean squared value of a cross-correlation function derived from an in-band calibration signal and the feedback signal of the feedback path.

Example 6 includes the subject matter of any of Examples 1-5, including or omitting optional elements, wherein the RMS component is further configured to generate a second root mean squared value based on a second feedback signal from the feedback path, wherein the second feedback signal is different from the feedback signal.

Example 7 includes the subject matter of any of Examples 1-6, including or omitting optional elements, further comprising an estimation component configured to generate a maximum root mean squared value based on a comparison of the second root mean squared value and the first root mean squared value and adjust the first delay based on the maximum root mean squared value.

Example 8 includes the subject matter of any of Examples 1-7, including or omitting optional elements, further comprising delay correction component, located within the feedback path, configured to generate a correction value based on the feedback signal and a calibration signal, and correct a deviation of an actual delay of the delay component from a target delay.

Example 9 includes the subject matter of any of Examples 1-8, including or omitting optional elements, further comprising an estimation component configured to generate a plurality of peak values associated with normalized values of a cross-correlation function, select at least one peak value of the plurality of peak values that satisfies a predetermined threshold, and providing the at least one peak value to the envelope tracking path to control the first delay.

Example 10 is a power amplifier device comprising a power amplifier, coupled to a signal generation path and an envelope tracking path, comprising a supply voltage input configured to receive a supply voltage that varies according to an input signal of a transmitter and an output configured to provide an output signal of the power amplifier, a delay component configured to generate a first delay of the envelope tracking path to correspond with a second delay of the signal generation path, a feedback path extending between the output of the power amplifier and a feedback input to the delay component. The feedback path comprises a feedback receiver, coupled to the output of the power amplifier, configured to generate a feedback signal based on the output signal and a delay correction component, coupled to the feedback receiver and the delay component, configured provide a correction value that is based on the feedback signal to the delay component, wherein the delay component is further configured to correct a deviation of the first delay of the envelope tracking path from a target delay based on the correction value.

Example 11 includes the subject matter of Example 10, wherein the delay correction component is configured to receive a calibration signal via a calibration input and generate the correction value as a function of the calibration signal and the feedback signal.

Example 12 includes the subject matter of any of Examples 10 or 11, including or omitting option elements, wherein the delay correction component comprises a cross-correlation component configured to generate a cross-correlation function of an in-band calibration signal based on the feedback signal of the feedback path.

Example 13 includes the subject matter of any of Examples 10-12, including or omitting option elements, wherein the in-band calibration signal comprises a calibration signal having a lower amplitude than the input signal, wherein the input signal comprises a radio frequency signal.

Example 14 includes the subject matter of any of Examples 10-13, including or omitting option elements, wherein the delay correction component comprises an RMS component configured to generate a first root mean squared value of a cross-correlation function derived from an in-band calibration signal and the feedback signal of the feedback path, and generate an additional root mean squared value of the cross-correlation function based on the in-band calibration signal and an additional feedback signal of the feedback path generated by the feedback receiver at a different delay during an active transmission than the first delay.

Example 15 includes the subject matter of any of Examples 10-14, including or omitting option elements, wherein the delay correction component further comprises an estimation component configured to generate a maximum root mean squared value based on a comparison of the additional root mean squared value and the first root mean squared value and adjust the first delay based on the maximum root mean squared value.

Example 16 includes the subject matter of any of Examples 10-15, including or omitting option elements, wherein the delay correction component further comprises an estimation component configured to generate peak values associated with the first root mean squared value and the additional root mean squared value of the cross-correlation function respectively, and select a peak value of the peak values that satisfies a predetermined threshold to adjust the first delay.

Example 17 includes the subject matter of any of Examples 10-16, including or omitting option elements, wherein the signal generation path comprises a signal generation component configured to generate a transmission signal via the input signal and a calibration signal from a calibration input of the transmitter.

Example 18 includes the subject matter of any of Examples 10-17, including or omitting option elements, wherein the delay correction component is configured to generate the correction value as a function of the calibration signal at the calibration input and the feedback signal from the output of the power amplifier.

Example 19 is a method for a power amplifier system, comprising receiving a plurality of input signals at an input terminal of the power amplifier system processing the plurality of input signals via an envelope tracking path to supply a variable voltage supply to a power amplifier based on an envelope of the plurality of input signals; processing the plurality of input signals to form a plurality of transmission signals via a signal processing path to the power amplifier system; and generating a correctional value that corrects for a deviation between an actual delay of the envelope tracking path with respect to the signal processing path and a target delay, as a function of a feedback signal provided in a feedback path from an output of the power amplifier to the envelope tracking path.

Example 20 includes the subject matter of claim 19, wherein the generating the correctional value comprises generating the correctional value as a function of the feedback signal and a calibration signal at a calibration input.

Example 21 includes the subject matter of any of Examples 19 or 20, including or omitting option elements, further comprising providing a calibration signal during an active transmission mode or a calibration mode of the power amplifier system to the plurality of input signals and the feedback signal, wherein the processing the plurality of input signals to the plurality of transmission signals comprises generating the plurality of transmission signals based on the plurality of input signals and the calibration signal.

Example 22 includes the subject matter of any of Examples 19-21, including or omitting option elements, further comprising generating a comparison of a calibration signal with the feedback signal, and generating a cross-correlation function of the calibration signal and the feedback signal based on the comparison.

Example 23 includes the subject matter of any of Examples 19-22, including or omitting option elements, wherein the calibration signal comprises a calibration frequency at an in-band channel and an amplitude that is different from an input amplitude of the plurality of input signals.

Example 24 includes the subject matter of any of Examples 19-23, including or omitting option elements, further comprising generating a plurality of cross-correlation functions based on a calibration frequency, the feedback signal at the actual delay during an active operation of the power amplifier system and at least one additional feedback signal during the active operation of the power amplifier system; and selecting at least one of the plurality of cross-correlation functions based on a set of predetermined criteria and correcting the actual delay based on the correctional value being derived from the at least one of the plurality of cross-correlation functions.

Example 25 includes the subject matter of any of Examples 19-24, including or omitting option elements, wherein the set of predetermined criteria comprises a maximum root mean squared value based on a comparison of the plurality of cross-correlation functions.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. An envelope tracking system, comprising:
   a transmitter configured to generate an output signal;
   an envelope tracking path configured to adaptively generate a supply voltage that varies based on an instantaneous envelope signal derived from an input signal;
   a signal processing path configured to generate a converted signal via a signal conversion of the input signal and provide the converted signal to a power amplifier;
   a delay component configured to generate a first delay of the envelope tracking path with respect to a second delay of the signal processing path, the first delay being tunable and based on a feedback signal of a feedback path that is derived from the output signal;
   a calibration component, operatively coupled to a cross-correlation component and the signal processing path downstream of the envelope tracking path branching from the signal processing path, configured to generate an in-band calibration signal based on the input signal and provide the in-band calibration signal to the cross-correlation component and to the signal processing path at a point downstream after the envelope tracking path branches from the signal processing path to isolate the in-band calibration signal from being received in the envelope tracking path; and the cross-correlation component, operatively coupled to a calibration path from the calibration component and the feedback path, configured to receive the in-band calibration signal from the calibration component separate from the input signal that is at the signal processing path and concurrent with the signal processing path processing the input signal, and perform a cross-correlation function of the in-band calibration signal received from the calibration path and the feedback signal received from the feedback path by identifying similar portions of the in-band calibration signal and the feedback signal.

2. The envelope tracking system of claim 1, wherein the delay component is further configured to modify the first delay of the envelope tracking path based on the feedback signal and the in-band calibration signal received during an active transmission of the transmitter, and wherein the cross-correlation component is further configured to preserve a spectral mask of the input signal by preventing an interference from being added to the input signal at the signal processing path by receiving the in-band calibration signal independently of and separately from the input signal and concurrent to the signal processing path processing the input signal with the in-band calibration downstream after branching from the envelope tracking path.

3. The envelope tracking system of claim 1, further comprising:
a feedback receiver, located in the feedback path, configured to generate the feedback signal derived from the output signal during an active transmission of the transmitter.

4. The envelope tracking system of claim 1, further comprising:
a feedback receiver, located in the feedback path, configured to generate the feedback signal derived from the output signal at the first delay during an active transmission of the transmitter, and a second feedback signal derived from the output signal that is at a higher or a lower delay than the first delay during the active transmission of the transmitter.

5. The envelope tracking system of claim 1, further comprising:
a root mean squared (RMS) component configured to generate a first root mean squared value of the cross-correlation function derived from the in-band calibration signal and the feedback signal of the feedback path.

6. The envelope tracking system of claim 5, wherein the RMS component is further configured to generate a second root mean squared value based on a second feedback signal from the feedback path, wherein the second feedback signal is different from the feedback signal.

7. The envelope tracking system of claim 6, further comprising:
an estimation component configured to generate a maximum root mean squared value based on a comparison of the second root mean squared value and the first root mean squared value and adjust the first delay based on the maximum root mean squared value.

8. The envelope tracking system of claim 1, further comprising:

a delay correction component, located within the feedback path, configured to generate a correction value based on the feedback signal and the in-band calibration signal, and correct a deviation of an actual delay of the delay component from a target delay.

9. The envelope tracking system of claim 1, further comprising:
an estimation component configured to generate a plurality of peak values associated with normalized values of the cross-correlation function, select at least one peak value of the plurality of peak values that satisfies a predetermined threshold, and providing the at least one peak value to the envelope tracking path to control the first delay.

10. A power amplifier device comprising:
a power amplifier, coupled to a signal generation path and an envelope tracking path, comprising a supply voltage input configured to receive a supply voltage that varies according to an input signal of a transmitter and an output configured to provide an output signal of the power amplifier;
a delay component configured to generate a first delay of the envelope tracking path to correspond with a second delay of the signal generation path;
a feedback path extending between the output of the power amplifier and a feedback input to the delay component, the feedback path comprising:
a feedback receiver, coupled to the output of the power amplifier, configured to generate a feedback signal based on the output signal;
a calibration component, operatively coupled to a cross-correlation component and a signal processing path downstream of where the envelope tracking path branches from the signal processing path, configured to generate a calibration signal based on the input signal and provide the calibration signal to the cross-correlation component and to the signal processing path at a point downstream after the envelope tracking path branches from the signal processing path to isolate the calibration signal from being received in the envelope tracking path; and
a delay correction component, coupled to the feedback receiver and the delay component, configured provide a correction value that is based on the feedback signal, wherein the delay component is further configured to correct a deviation of the first delay of the envelope tracking path from a target delay based on the correction value, comprising:
the cross-correlation component, operatively coupled to a calibration path from the calibration component and the feedback receiver, configured to receive the calibration signal independently of, and separately from, the input signal that is at the signal processing path and concurrent with the signal processing path processing the input signal, perform a cross-correlation function of the calibration signal received from the calibration path and the feedback signal received from the feedback receiver by identifying similar portions of the calibration signal and the feedback signal.

11. The power amplifier device of claim 10, wherein the delay correction component is configured to receive the calibration signal via a calibration input of the calibration path, generate the correction value as a function of the calibration signal and the feedback signal and provide the calibration signal to the signal generation path while not providing the calibration signal to the envelope tracking path.

12. The power amplifier device of claim 10, wherein the calibration component is further configured to generate the calibration signal based on the input signal by generating the calibration signal with a lower amplitude than the input signal.

13. The power amplifier device of claim 10, wherein the delay correction component comprises:
   an RMS component configured to generate a first root mean squared value of a cross-correlation function derived from an in-band calibration signal and the feedback signal of the feedback path, and generate an additional root mean squared value of the cross-correlation function based on the in-band calibration signal and an additional feedback signal of the feedback path generated by the feedback receiver at a different delay during an active transmission than the first delay.

14. The power amplifier device of claim 13, wherein the delay correction component further comprises an estimation component configured to generate a maximum root mean squared value based on a comparison of the additional root mean squared value and the first root mean squared value and adjust the first delay based on the maximum root mean squared value.

15. The power amplifier device of claim 13, wherein the delay correction component further comprises an estimation component configured to generate peak values associated with the first root mean squared value and the additional root mean squared value of the cross-correlation function respectively, and select a peak value of the peak values that satisfies a predetermined threshold to adjust the first delay.

16. The power amplifier device of claim 10, wherein the signal generation path comprises a signal generation component configured to generate a transmission signal via the input signal and the calibration signal, wherein the delay correction component is further configured to provide the calibration signal to the signal generation path.

17. The power amplifier device of claim 16, wherein the delay correction component is configured to generate the correction value as a function of the calibration signal at the calibration input and the feedback signal from the output of the power amplifier.

18. A method for a power amplifier system, comprising:
   receiving a plurality of input signals at an input terminal of the power amplifier system;
   processing the plurality of input signals via an envelope tracking path to supply a variable voltage supply to a power amplifier based on an envelope of the plurality of input signals;
   processing the plurality of input signals to form a plurality of transmission signals via a signal processing path to the power amplifier system;
   receiving, at a point of the signal processing path downstream of where the envelope tracking path branches from the signal processing path and at a delay correction component, a calibration signal that is separate from the plurality of input signals at the signal processing path and concurrent with the signal processing path processing the plurality of input signals; and
   generating, via a delay correction component, a correctional value that corrects for a deviation between an actual delay of the envelope tracking path with respect to the signal processing path and a target delay, as a function of a cross correlation by receiving the calibration signal independently of, and separately from, the plurality of input signals at the signal processing path and concurrent with the signal processing path processing the input signal, wherein the calibration signal is generated based on the input signal, identifying similar portions of the calibration signal at the calibration path and a feedback signal provided in a feedback path from an output of the power amplifier to the envelope tracking path.

19. The method of claim 18, further comprising:
   providing, via the delay correctional component, the calibration signal during an active transmission mode or a calibration mode of the power amplifier system to the plurality of input signals and the feedback signal, wherein the processing the plurality of input signals to the plurality of transmission signals comprises generating the plurality of transmission signals based on the plurality of input signals and the calibration signal.

20. The method of claim 18, further comprising:
   generating the calibration signal with a calibration frequency at an in-band channel and an amplitude that is less than an input amplitude of the plurality of input signals.

21. The method of claim 18, further comprising:
   generating a plurality of cross-correlation functions based on a calibration frequency, the feedback signal at the actual delay during an active operation of the power amplifier system and at least one additional feedback signal during the active operation of the power amplifier system; and
   selecting at least one of the plurality of cross-correlation functions based on a set of predetermined criteria and correcting the actual delay based on the correctional value being derived from the at least one of the plurality of cross-correlation functions.

22. The method of claim 21, wherein the set of predetermined criteria comprises a maximum root mean squared value based on a comparison of the plurality of cross-correlation functions.

* * * * *